United States Patent
Lee et al.

(10) Patent No.: US 6,319,824 B1
(45) Date of Patent: Nov. 20, 2001

(54) METHOD OF FORMING A CONTACT HOLE IN A SEMICONDUCTOR DEVICE

(75) Inventors: Se-hyeong Lee, Sungnam; Ji-chul Shin, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/453,215

(22) Filed: Dec. 3, 1999

(30) Foreign Application Priority Data

Dec. 14, 1998 (KR) .................................................. 98-54877

(51) Int. Cl.[7] ................ H01L 21/4763; H01L 21/8238; H01L 21/8242
(52) U.S. Cl. ......................... 438/639; 438/233; 438/243; 438/253; 438/622; 438/637; 438/671; 438/736; 438/717
(58) Field of Search ..................... 438/636, 637, 438/639, 643, 647, 657, 698, 622, 623, 666, 671, 672, 700, 717, 735, 736, 737, 738, 740, 233, 243, 253, 256, 254, 255, 397–399

(56) References Cited

U.S. PATENT DOCUMENTS

| | | | |
|---|---|---|---|
| 5,087,591 | * | 2/1992 | Teng ...................................... 437/225 |
| 5,414,221 | * | 5/1995 | Gardner ................................ 174/261 |
| 5,631,185 | * | 5/1997 | Kim et al. ............................. 438/397 |
| 6,121,098 | * | 9/2000 | Strobl ................................... 438/301 |

FOREIGN PATENT DOCUMENTS 8148565   6/1996   (JP) .

* cited by examiner

*Primary Examiner*—Charles Bowers
*Assistant Examiner*—Thanhha Pham
(74) *Attorney, Agent, or Firm*—The Law Offices of Eugene M. Lee, P.L.L.C.

(57) ABSTRACT

A method of forming a contact hole for a semiconductor device, and a method of forming a capacitor for a semiconductor device using the same. An interlayer dielectric layer, a contact mask material layer including of a material having a high etching selectivity with respect to the interlayer dielectric layer, an anti-reflection layer, and a photoresist layer, are formed on a semiconductor substrate. A photoresist pattern is formed from the photoresist layer to expose part of the anti-reflection layer, and a flow process is performed on the photoresist pattern to expose even a smaller amount of the anti-reflection layer. The anti-reflection layer and the contact mask material layer are then etched to expose part of the interlayer dielectric layer, and the interlayer dielectric layer is etched to form a contact hole.

11 Claims, 5 Drawing Sheets

METHOD OF FORMING A CONTACT HOLE IN A SEMICONDUCTOR DEVICE

BACKGROUND OF THE INVENTION

1. Field of the Invention

The present invention relates to a method of forming a contact hole and a capacitor for a semiconductor device, and more particularly, to a method of forming a small contact hole through an interlayer dielectric (ILD) layer having a small critical dimension and a large step coverage, and a method of forming a capacitor of a semiconductor device using the method.

2. Description of the Related Art

With the increase in the level of integration of semiconductor devices, the need for interconnection patterns having a finer linewidth has increased. In the photolithography process for forming such a fine contact pattern, first a photoresist pattern having a critical dimension (CD) of about 200 nm can be formed using deeply penetrating ultraviolet rays. Then, a photoresist (PR) flow process is performed in order to form a photoresist pattern having a finer linewidth than the previously formed photoresist pattern. The thickness of the photoresist pattern decreases as a result of the flow process and the width of the contact hole exposing the underlayer becomes narrower, so that a pattern of the desired fineness can be formed in subsequent processing. According to this method, a wire pattern or a contact pattern having a CD of around 130 nm can be obtained.

However, the PR flow process for achieving a fine linewidth causes the following problems. A considerable part of the photoresist pattern, the thickness of which has been decreased by the flowing process, is etched when the layer under the photoresist pattern (an ILD layer made of silicon oxide for example) is dry etched. As a result, the desired shape of the mask pattern is lost. If excessive etching is performed, a part or all of the photoresist pattern may be removed from the top of the substrate, which may result in enlarging the width of the opening at the top of the contact holes more than desired. The sidewalls of the contact holes become slanted with an increase in depth of the hole, so that the width at the bottom of the contact hole is narrower than the width of the opening at the top of the holes. If this phenomenon is serious, the contact may have no opening at the bottom.

If there is no technical restriction on the thickness of the photoresist layer, merely forming a thicker photoresist layer can be one of the solutions for the above described problems. However, since the resolution of the exposure apparatus depends on the exposure light source used for the photolithography process, the thickness of the photoresist cannot be arbitrarily selected. Also, if excessive photoresist is deposited, the photoresist layer cannot be completely removed by the subsequent ashing process and the byproduct from the ashing process may refill the contact holes, so that the underlayer is not exposed in the contact holes.

Other problems may also arise. A photoresist pattern having a small CD is required to produce a small contact hole, but the process margin may not be enough during the photolithography process for such a purpose. Also, byproducts produced during the development step (e.g., residues or bubbles of scununy byproduct) may be deposited on the contact holes, so that the contact holes are not opened.

Such problems are serious in third generation products such as, for example, the 256 megabyte DRAM, a semiconductor device having a 0.17 design rule which requires a fine contact having a CD of 120 nm and a depth of 10,000 Å. Thus, the problems described above, e.g., that the upper part of the contact is much broader than the lower part of the contact and that the contact hole is not opened, must be solved in third generation products.

Hereinafter, a conventional method for forming a contact and the problems thereof will be described with reference to the appended drawings. FIG. 1 is a vertical sectional view of a semiconductor device illustrating the formation of a photoresist pattern. An ILD layer 15 and an anti-reflection layer 20 are stacked in sequence on a semiconductor substrate 10, and then photoresist is deposited to a predetermined thickness T1 on the top surface of the resulting structure. A predetermined photolithography process is performed on the deposited photoresist to form a photoresist pattern 25 that exposes part of the layer under the photoresist layer, the anti-reflection layer 20, by a predetermined width W1. The anti-reflection layer 20 is for preventing light irradiated onto the surface of the semiconductor substrate from reflecting during the photolithography process performed to obtain the photoresist pattern 25.

FIG. 2 is a vertical sectional view illustrating a conventional photoresist flow process in which the width of the opening in the photoresist pattern, through which the anti-reflection layer is exposed, is reduced from W1 to W2. When the photoresist flow process is performed, the original photoresist pattern 25 (see FIG. 1) is deformed to a photoresist pattern 25a having a reduced thickness T2 (smaller than the thickness T1 shown in FIG. 1) and a reduced exposure width W2 (narrower than the width W1 shown in FIG. 1).

FIG. 3 is a vertical sectional view showing a contact hole passing through the ILD layer 15, formed by a conventional method. Using the photoresist pattern 25a of FIG. 2 as a mask, etching is performed to form a contact hole passing through the anti-reflection layer 20 and the ILD layer 15. Then the material layers 25a and 20 deposited on the ILD layer 15 are removed, resulting in the structure of FIG. 3. It can be seen in FIG. 3 that the lower width $W_b$ of the contact hole is narrower than the upper width $W_t$ of the contact hole. This is due to the slanted sidewalls of the contact hole. If the sidewalls slant too much, the bottom of the contact hole which exposes the semiconductor substrate or a lower interconnection level (not shown) may have no opening at all.

The present invention is directed to overcoming or at least reducing the effects of one or more of the problems set forth above.

SUMMARY OF THE INVENTION

The present invention is directed to providing a method of forming a contact hole and a capacitor in a semiconductor device which reduces or avoids at least one of the above problems.

According to one aspect of the invention, there is provided a method of forming a contact hole for a semiconductor device, including stacking in sequence an interlayer dielectric (ILD) layer, a contact mask material layer made of a material having a high etching selectivity with respect to the ILD layer, an anti-reflection layer, and a photoresist layer on a semiconductor substrate. Then, the photoresist layer is patterned to form a first photoresist pattern exposing a predetermined part of an upper surface of the anti-reflection layer, and a flow process is performed on the first photoresist pattern to produce a second photoresist pattern, which exposes a smaller amount of the upper surface of the anti-reflection layer than the first photoresist pattern.

Subsequently, the anti-reflection layer and the contact mask material layer are etched using the second photoresist pattern as a mask, to form an anti-reflection layer pattern and a contact mask pattern exposing the upper surface of the interlayer dielectric layer. The interlayer dielectric layer is then etched using the second photoresist pattern, the anti-reflection layer pattern, and the contact mask pattern as an etch mask, to form a contact hole.

According to another aspect of the invention, there is provided a method of forming a capacitor for a semiconductor device, further including removing the second photoresist pattern before etching the interlayer. The anti-reflection layer pattern may be removed at this time or after the second photoresist pattern is removed. Then, insulation spacers are formed on the sidewalls of the contact mask pattern and the sidewalls of the contact hole. If the anti-reflection layer pattern has not already been removed, it may be removed from the contact mask pattern during the etching process for forming the spacers to avoid the need for an additional processing step. A conductive layer is formed to fill the contact hole and to cover the upper surface of the contact mask pattern, and the conductive layer and the contact mask pattern are etched to form a storage node pattern. Then a capacitor of a semiconductor device may be completed using conventional methods.

BRIEF DESCRIPTION OF THE DRAWINGS

The above features and advantages of the present invention will become more apparent by describing in detail preferred embodiments thereof with reference to the attached drawings in which.

DESCRIPTION OF SPECIFIC EMBODIMENTS

Figure 1:
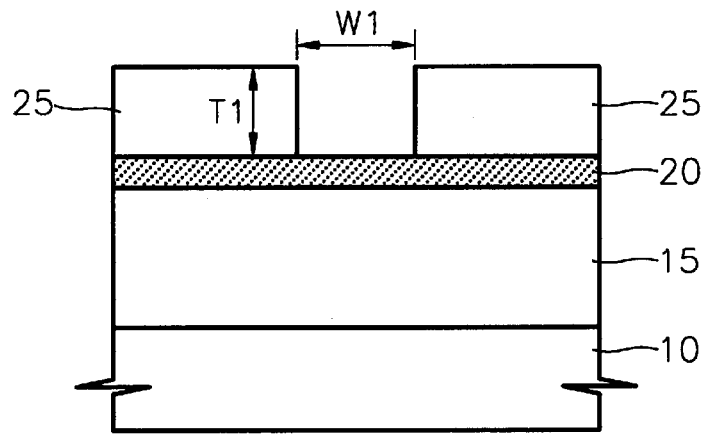
FIGS. 1 through 3 are vertical sectional views for illustrating a conventional method of forming a contact hole.
Figure 2:
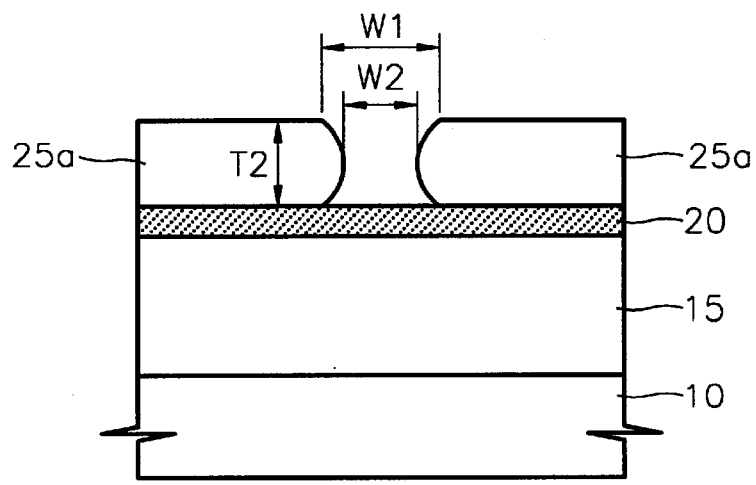

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those of ordinary skilled in the art. In the drawings, the thicknesses of layers and regions are exaggerated for clarity. It will also be understood that when a layer is referred to as being "on" another layer or substrate, it can be directly on the other layer or substrate, and one or more intervening layers may also be present. Further, it will be understood that when a layer is referred to as being "under" another layer, it can be directly under, and one or more intervening layers may also be present. Korean application no. 98-54877 filed Dec. 14, 1998, is hereby incorporated by reference as if fully set forth herein.

Figure 4:
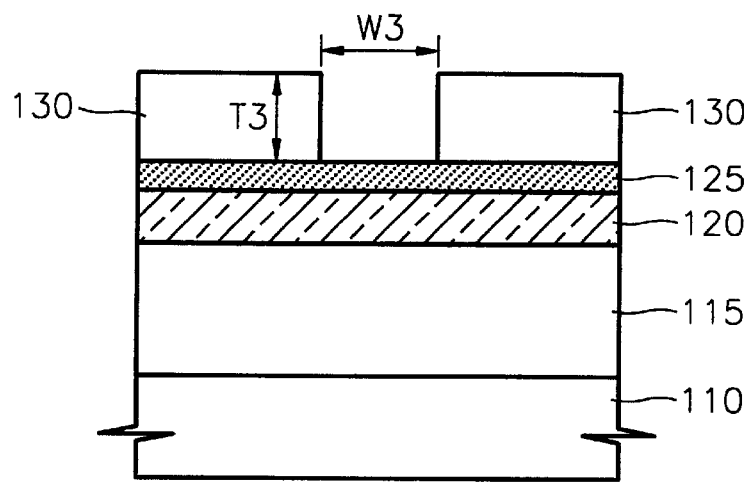
FIGS. 4 through 12 are vertical sectional views for illustrating a method of forming a contact hole and a method of forming a capacitor using the same method according to the present invention.

FIGS. 4 through 12 are vertical sectional views illustrating a method of forming a contact hole according to a preferred embodiment of the present invention. FIG. 4 illustrates the formation of a photoresist pattern. An interlayer dielectric (ILD) layer 115, a polysilicon layer 120 doped with impurities and used as a contact mask, and an anti-reflection layer 125 are stacked in sequence on a semiconductor substrate 110. The impurity-doped polysilicon layer 120 is preferably comprised of a material having a high etching selectivity with respect to the ILD layer 115.

A photoresist layer is then deposited on the top of the resulting structure to a predetermined thickness T3. A predetermined photolithography process is performed on the deposited photoresist to form a photoresist pattern 130 that exposes a predetermined part of the anti-reflection layer 125, the layer under the deposited photoresist, by a predetermined width W3. The anti-reflection layer 125 prevents formation of the photoresist pattern with more than the desired linewidth caused by reflection of the light irradiated onto the entire surface of the semiconductor substrate during the photolithography process for forming the photoresist pattern 130. Preferably, where the impurity-doped polysilicon layer 120 is formed to a thickness of 500–2,000 Å, the anti-reflection layer 125 of silicon oxynitride (SiON) is formed to a thickness of 200–800 Å.

Figure 5:
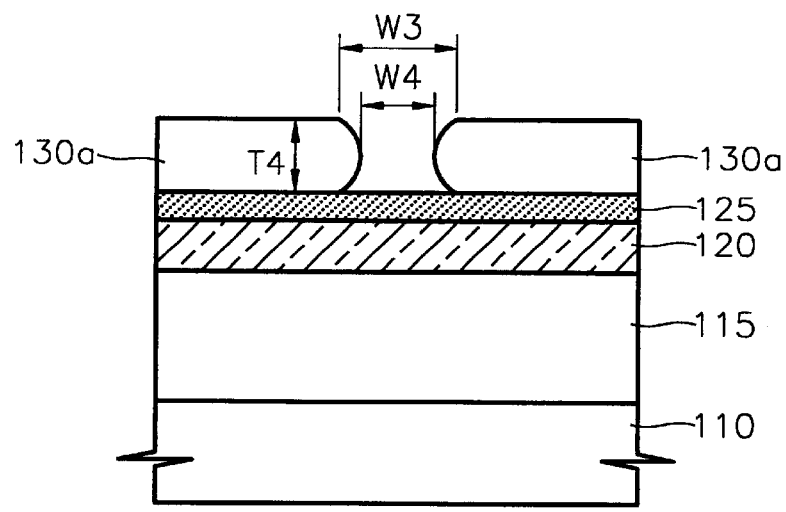

FIG. 5 illustrates a photoresist flow process in which the width of an opening of the photoresist pattern, exposing the anti-reflection layer 125, is decreased from W3 to W4. As a result of the photoresist flow process, the original photoresist pattern 130 (see FIG. 4) is deformed into a photoresist pattern 130a, the thickness T4 and the exposure width W4 of which are both smaller than the thickness T3 and the exposure width W3 of the original photoresist pattern 130 shown in FIG. 4.

Figure 6:
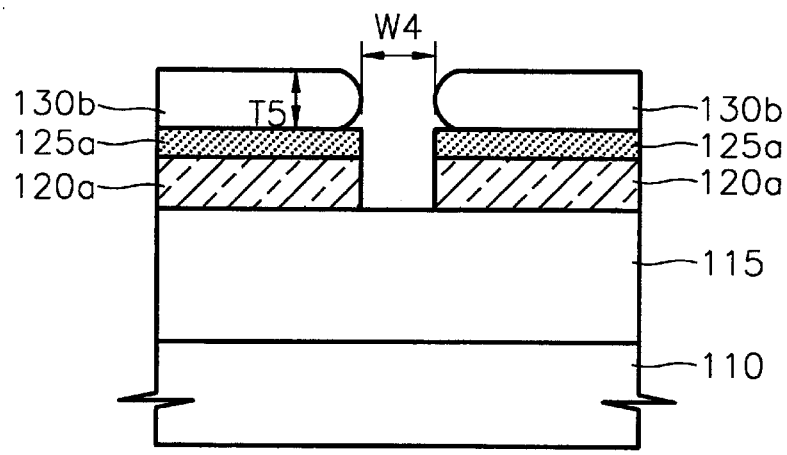

FIG. 6 illustrates the formation of a polysilicon layer pattern to be used as a contact mask. Etching is performed using the photoresist pattern 130a of FIG. 5 as an etch mask, resulting in a pattern in which anti-reflection layer pattern 125a and impurity-doped polysilicon layer pattern 120a are stacked, exposing a predetermined part of the ILD layer 115. The properties of the remaining photoresist pattern 130b are not different from that of the photoresist pattern 130a of FIG. 5, except that the thickness T5 of the photoresist pattern 130b may be less than the thickness T4 of photoresist pattern 130a. Also, the exposure width W4 of the opening of the stacked patterns 120a and 125a is shown as equal to the width of the opening in the photoresist pattern 130b, but width W4 actually may be wider or narrower than that of the photoresist pattern 130b, depending on the etching process used.

Figure 7:
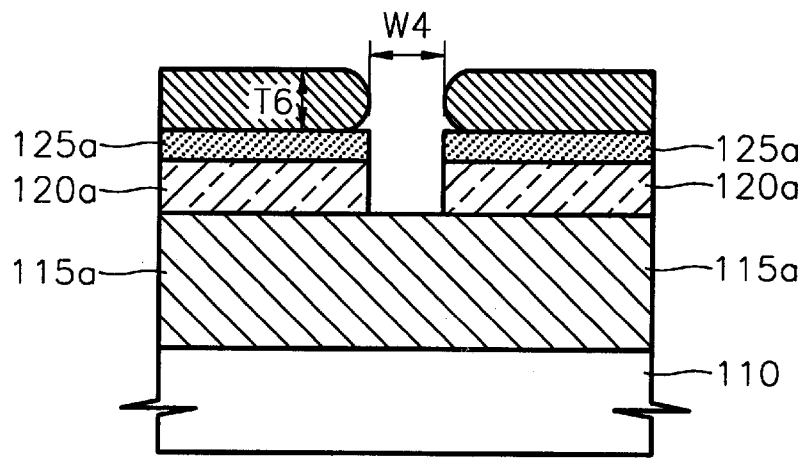

FIG. 7 illustrates the formation of a contact hole using the patterns 130c, 125a, and 120a stacked on the ILD layer 115 as an etch mask. Here, the properties of the photoresist pattern 130c are the same as those of the photoresist pattern 130b of FIG. 6, except that, because the photoresist pattern 130c is the uppermost pattern, the thickness T6 is reduced from the thickness T5 of FIG. 6 during the etching process.

There may be a semiconductor device formed on a part of the semiconductor substrate 110, which is exposed through the contact hole in the ILD layer 115a, and the contact hole can be filled with a conductive material to make an electric connection with an upper interconnection level not yet deposited. Here, the etching step for forming the contact hole is preferably performed using a fluoride gas containing carbon (C) and fluorine (F) as major components, preferably $C_4F_8$, as an etching gas. Preferably $C_4F_8$ is supplied to an etching chamber at a flow rate of 10–25 SCCM. Also, when etching is performed using $C_4F_8$ as an etching gas, a gas mixture of carbon monoxide (CO) and argon (Ar) is preferably used as an ambient gas. Preferably, CO of the ambient gas is supplied to the etching chamber at a flow rate of 150–250 SCCM and Ar is supplied to the etching chamber at a flow rate of 200–400 SCCM. Preferably, 1,300–2,000 W of electric power is supplied to the etching chamber, and the internal pressure of the etching chamber is maintained at 20–50 mTorr.

Figure 3:
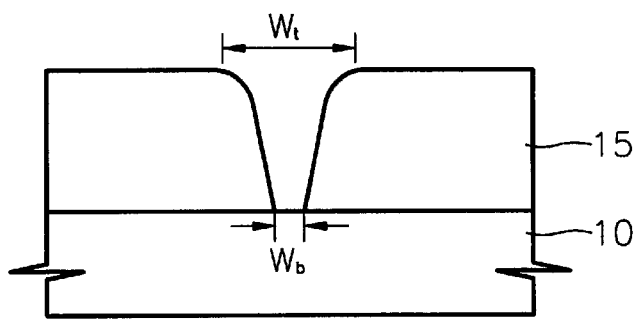
Figure 8A:
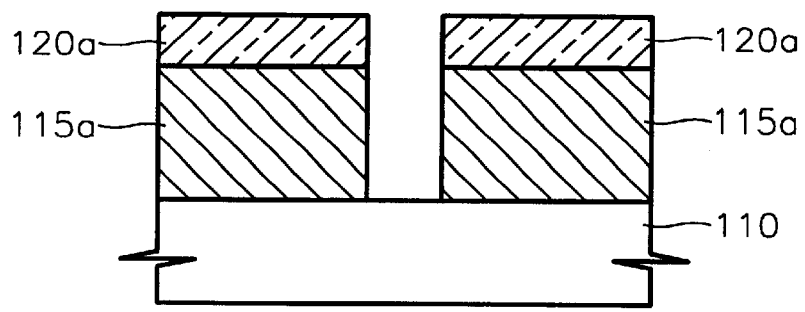
Figure 8B:
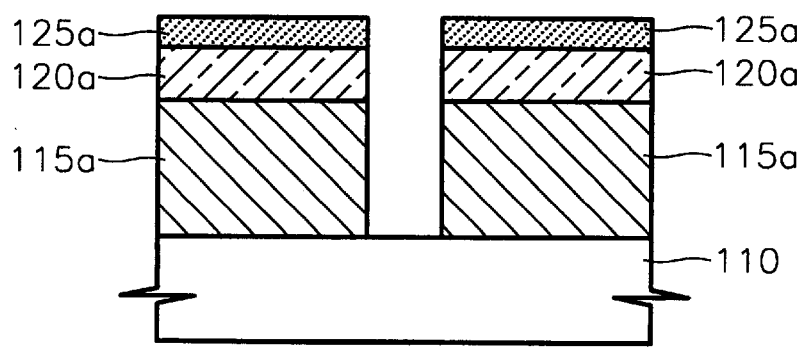

FIG. 8A illustrates the structure obtained by intentionally removing the photoresist pattern 130c and the anti-reflection layer pattern 125a of FIG. 7 from the top surface of the impurity-doped polysilicon layer pattern 120a after the contact hole has been formed as described with reference to FIG. 7. The photoresist pattern 130c is preferably removed by ashing. Compared to FIG. 3, it is clear that the upper width of the contact hole is nearly the same as the lower width of the contact hole due to the steep sidewalls of the contact hole, thus solving the problem of the conventional method. The anti-reflection layer pattern 125a (see FIG. 7) must be removed during a capacitor manufacturing process for a semiconductor device. However, it is not necessary to remove the anti-reflection layer pattern 125a (see FIG. 8B) immediately after the photoresist layer pattern 130c is removed by ashing. Then, if the anti-reflection layer pattern 125a of FIG. 7 can be removed simultaneously in another subsequent process, the manufacturing process of a semiconductor device can be simplified. This efficient manufacturing process will be described in more detail later with reference to FIG. 10.

Figure 9A:
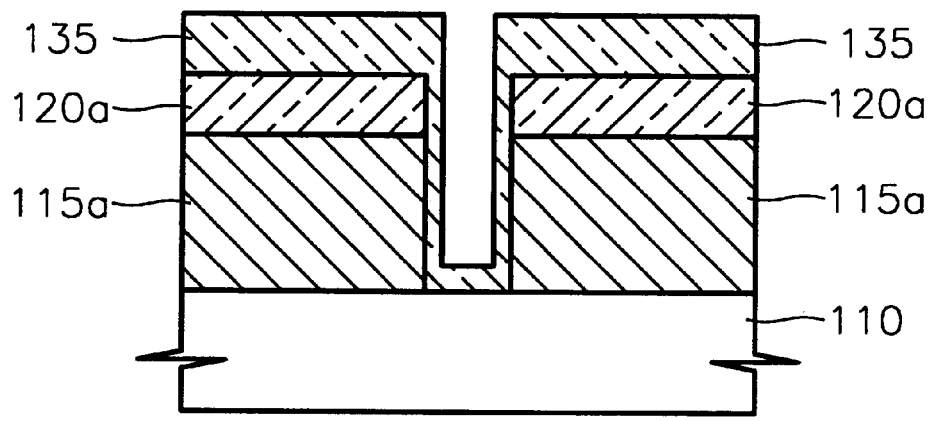
Figure 9B:
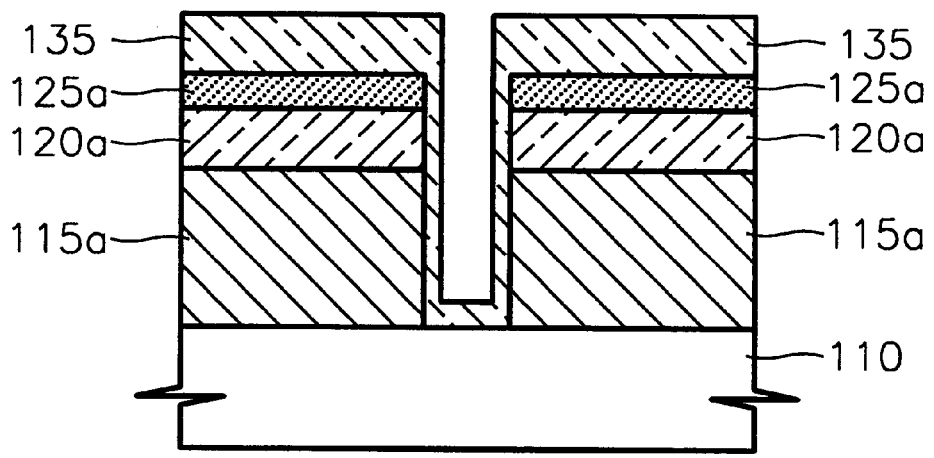
Figure 10:
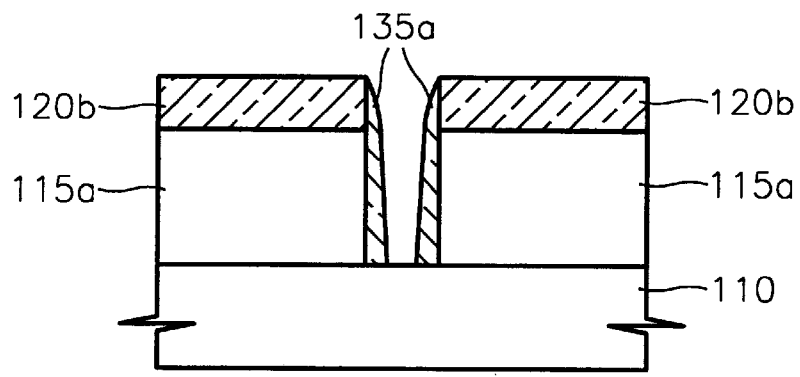

FIGS. 9A, 9B and 10 are vertical sectional views illustrating the formation of spacers that surround only the sidewalls of the contact hole. Referring to FIG. 9A, after the anti-reflection layer pattern 125a formed on the impurity-doped polysilicon layer pattern 120a is removed as described with reference to FIG. 8A. an insulation layer 135 is formed completely surrounding the sidewalls and bottom of the contact hole as well as the exposed top surface of the impurity-doped polysilicon layer pattern 120a. The insulation layer 135 is preferably formed of an insulating material such as silicon nitride (SiN), silicon oxynitride (SiON), or high temperature oxide (HTO).

Referring to FIG. 10, an etching process is performed on the insulation layer 135 of FIGS. 9A or 9B so that spacers 135a covering only the sidewalls of the contact hole(i.e., only the sidewalls of the impurity-doped polysilicon layer pattern 120b and the ILD layer pattern 115a) are formed. Here, it is preferable to perform the etching for forming the spacers 135a so that the spacers 135a can insulate a storage node pattern 140a (see FIG. 12) from the environment. Preferably, the insulation layer 135 of FIG. 9A is anisotropically etched by a dry etching method. As described above, if the anti-reflection layer pattern 125a of FIG. 7 is not removed after forming the contact hole, the anti-reflection layer pattern 125a can be removed simultaneously during the etching performed to form the spacers 135a (see FIG. 8B, FIG. 9B and FIG. 10). That is, an additional step for removing the anti-reflection layer is not required, and there is the advantage that the manufacturing process can be simplified.

Figure 11:
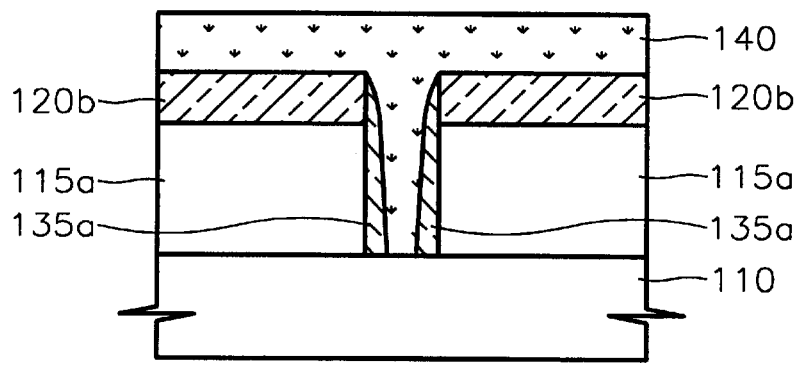
Figure 12:
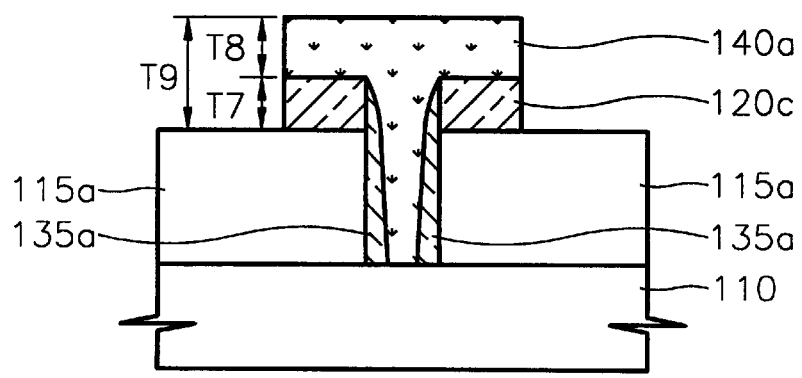

FIGS. 11 and 12 are vertical sectional views illustrating the formation of storage node patterns for a capacitor. Referring to FIG. 11, a conductive layer 140 is formed on the entire surface of the substrate 110 having the spacers 135a which are formed through the steps illustrated with reference to FIG. 10. Here, the contact hole having the spacers 135a is refilled with the conductive layer 140. The conductive layer 140 must contact the upper surface of the semiconductor substrate 110 exposed through the contact hole to make an electrical connection. Preferably, the conductive layer 140 is formed of the same material used for the impurity-doped polysilicon layer pattern 120b because this will result in a better interface between the two layers. Thus, in forming a capacitor, the formation of the storage node pattern 140a/120c can be simplified. However, if desired, the conductive layer 140 may be formed from a different material from that used in the polysilicon layer pattern 120b.

Referring to FIG. 12, patterning (i.e., etching) of the conductive layer 140 and the polysilicon layer pattern 120b of FIG. 11 into the storage node pattern 140a/120c is performed, preferably in the same chamber. The conductive layer 140 of FIG. 11 is changed into the pattern 140a covering the area surrounding the contact hole by the etching. The polysilicon layer pattern 120b of FIG. 11 formed under the conductive layer 140 is changed into the polysilicon layer pattern 120c. Preferably, during the etching process for forming the storage node pattern 140a/120c, the upper surface of the ILD layer pattern 115a is exposed. In FIG. 12, the total thickness T9 of the storage node pattern 140a/120c is expressed as the sum of the thickness T8 of the conductive layer pattern 140a and the thickness T7 of the polysilicon layer pattern 120c.

The reason that the polysilicon layer pattern 120c acts as a part of the storage node pattern 140a/120c is that the polysilicon layer pattern 120c is doped with impurities for conductivity. The polysilicon layer pattern 120c of thickness T7, which was used for another purpose (i.e., as an etch mask during the etching step for forming a contact hole in the ILD layer 115a), can act as a part of the storage node pattern 140a/120c of a capacitor. Thus, the thickness of conductive layer 140 formed in the step illustrated in FIG. 11 is reduced, thereby lowering the manufacturing cost and the time required for the deposition of the conductive layer 140, and increasing the manufacturing efficiency.

The method of forming a capacitor for a semiconductor device according to the present invention requires subsequent steps, e.g., the steps of forming a dielectric layer and forming a plate node. The subsequent steps can be performed using a conventional technology without affecting the purpose, structure, and effect of the present invention. Also, it is obvious that the method of forming a contact for a semiconductor device and the method of forming a capacitor for a semiconductor device according to the present invention can be applied directly or indirectly to other steps during the manufacture of a semiconductor device. In particular, the method of the present invention may be applied to the step of forming a plug that goes through an interposed material layer and connects a higher interconnection level and a lower interconnection level to achieve a plurality of connections.

As described above, when a contact which is fine enough to satisfy the need for a highly integrated semiconductor device is formed by the method according to the present invention, the problems of the conventional method can be reduced or avoided. These problems include the broadening of a contact hole at the upper part, contact failure where a contact hole is filled with byproducts produced during the photoresist ashing process, and difficulty in selection of a photoresist etch mask required to form a contact hole passing through a thick ILD layer. Thus, the present invention can contribute directly toward more highly integrated semiconductor devices. Also, the material layer used as a photoresist etch mask to form the contact hole is not removed and can be used as a part of another element to be formed later, so that the cost is reduced and the manufacturing efficiency is improved.

What is claimed is:

1. A method of forming a semiconductor device, comprising:

stacking on each other in sequence an interlayer dielectric layer, a contact mask material layer comprised of a material having a high etching selectivity with respect to the interlayer dielectric layer, and an anti-reflection layer, and a photoresist layer, on a semiconductor substrate;

patterning the photoresist layer to form a first photoresist pattern to expose a part of a surface of the anti-reflection layer;

performing a flow process on the first photoresist pattern to produce a second photoresist pattern which exposes a smaller amount of the surface of the anti-reflection layer than the first photoresist pattern;

etching the anti-reflection layer and the contact mask material layer using the second photoresist pattern as a mask to form an anti-reflection layer pattern and a contact mask pattern exposing a part of the surface of the interlayer dielectric layer;

etching the interlayr dieletric layer using the second photoresist pattern, the anti-reflection layer patter, and the contact mask pattern as an etch mask, to form a contact hole;

removing the second photoresist pattern;

forming insulation spacers on sidewalls of the contact hole, and simultaneously removing the anti-reflection layer pattern during the forming of the insulation spacers;

forming a conductive layer to fill the contact hole and to cover an upper surface of the contact mask pattern; and etching the conductive layer and the contact mask pattern to form a storage node pattern.

2. A method of forming a semiconductor device according to claim 1, wherein the insulation spacers comprise a material selected from the group consisting of silicon nitride, silicon oxynitride, and high temperature oxide.

3. A method of forming a semiconductor device according to claim 1, wherein the contact mask material layer comprises a conductive material.

4. A method of forming a semiconductor device according to claim 1, wherein the contact mask material layer comprises impurity-doped polysilicon.

5. A method of forming a semiconductor device according to claim 4, wherein the thickness of the impurity-doped polysilicon layer is between about 500 and about 2000 Å.

6. A method of forming a semiconductor device according to claim 3, wherein the anti-reflection layer comprises silicon oxynitride.

7. A method of forming a semiconductor device according to claim 5, wherein the thickness of the anti-reflection layer is between about 200 and about 800 Å.

8. A method of forming a semiconductor device according to claim 3, wherein etching the interlayer dielectric layer comprises using $C_4F_8$ as an etching gas.

9. A method of forming a semiconductor device according to claim 8, wherein the etching gas is supplied at a flow rate of from 10 to 25 SCCM.

10. A method of forming a semiconductor device according to claim 8, wherein etching the interlayer dielectric layer comprises using $C_4F_8$ as an etching gas and a gas mixture comprising carbon monoxide and argon gas as an ambient gas.

11. A method of forming a semiconductor device according to claim 10, wherein the carbon monoxide in the ambient gas is supplied at a flow rate from about 150 to about 250 SCCM, the argon gas in the ambient gas is supplied at a flow rate from about 200 to about 400 SCCM, an electric power of about 1,300 to about 2,000 W is supplied to the etching chamber, and an ambient pressure of from about 20 to about 50 mTorr is maintained.

* * * * *